United States Patent [19]
Jun et al.

[11] Patent Number: 5,792,704
[45] Date of Patent: Aug. 11, 1998

[54] METHOD FOR FABRICATING WIRING IN SEMICONDUCTOR DEVICE

[75] Inventors: Young Kwon Jun, Seoul; Yong Kwon Kim; Jin-Won Park, both of Choongchungbook-Do; Nae-Hak Park, Seoul, all of Rep. of Korea

[73] Assignee: LG Semicon Co., Ltd., Cheongju, Rep. of Korea

[21] Appl. No.: 579,477

[22] Filed: Jan. 4, 1996

[30] Foreign Application Priority Data

Sep. 2, 1995 [KR] Rep. of Korea .............. 28691/1995

[51] Int. Cl.$^6$ ............................................. H01L 21/4763
[52] U.S. Cl. .................... 438/624; 438/634; 438/637; 438/638; 438/668; 438/666; 438/740
[58] Field of Search ................................ 438/624, 625, 438/634, 637, 638, 668, 671, 740, 666

[56] References Cited

U.S. PATENT DOCUMENTS

| | | |
|---|---|---|
| 5,126,006 | 6/1992 | Cronin et al. ............... 156/643 |
| 5,270,240 | 12/1993 | Lee . | |
| 5,354,711 | 10/1994 | Heitzmann et al. ............ 437/182 |

OTHER PUBLICATIONS

Kaanta et al., "Dual Damascence: A Wiring Technology", IEEE 1991 VMIC Conference, Jun. 11-12, 1991, pp. 144-152.

T. Ema et al., "3-Dimensional Stacked Capacitor Cell for 16M and 64M Drams.", 1988, pp. 592-595.

K.H. Kusters et al., "A High Density 4Mbit dram Process Using a Fully Overlapping Bitline Contact (FOBIC) Trench Cell," 93-94.

K. Ueno et al., "A Quarter-Micron Planarized Interconnection Technology With Self-Aligned Plug", IEEE Journal, 1992, pp. 305-308.

*Primary Examiner*—Charles L. Bowers, Jr.
*Assistant Examiner*—Lynne A. Gurley
*Attorney, Agent, or Firm*—Fleshner & Kim

[57] ABSTRACT

A method for fabricating wiring in a semiconductor device in which a conductor line and a contact hole are formed by self-alignment, includes the steps of: forming an insulating layer on a substrate; forming an etch-step layer on the insulating layer; etching the etch-stop layer of a wiring region connected to a window and the insulating layer to a predetermined thickness; forming a mask layer on the etch-stop layer and the insulating layer; etching the mask layer to remove the mask layer at the central part of the window; and etching the insulating layer of the central part of the window so as to form a contact hole. By applying such a method, a highly improved reliability can be obtained, and a process thereof is simplified by a single photolithography. Also, the contact hole is formed by self-alignment in the lengthwise direction and in the vertical direction of the conductor line.

40 Claims, 7 Drawing Sheets

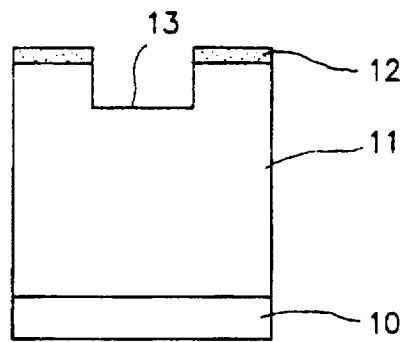
FIG.4E
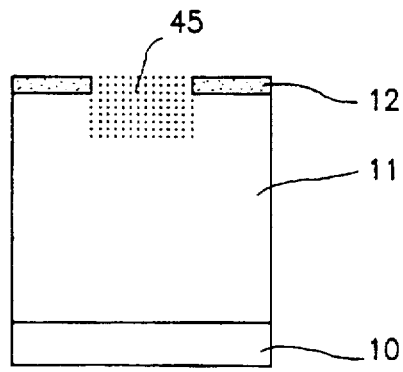
FIG.4F
FIG. 5
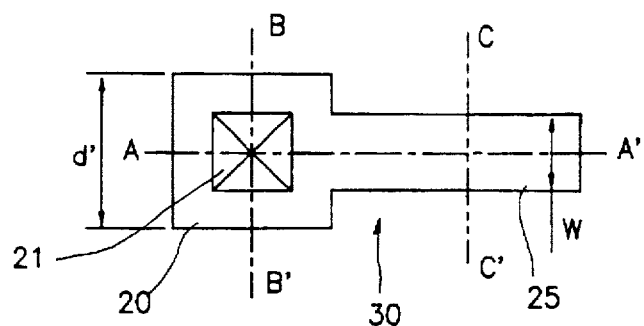
FIG. 6
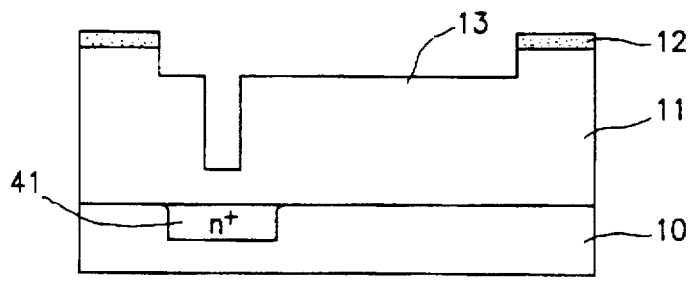

METHOD FOR FABRICATING WIRING IN SEMICONDUCTOR DEVICE

BACKGROUND OF THE INVENTION

1. Field of the Invention

The present invention relates to a method for fabricating wiring of a semiconductor device by which a conductor line and a contact hole are formed by self-alignment.

2. Description of the Prior Art

Recently, as techniques for fabricating semiconductor devices have been highly developed, the integration degree of semiconductor devices becomes high. As such, the width of conductor lines and the size of contact holes are accordingly reduced, causing a problem that alignment margins thereof are hardly obtained. That is, in a conventional semiconductor device, if the conductor line and the contact hole would be mis-aligned, a contact area between them would be reduced while its current density would be increased, which results in a degradation of reliability. Also, in the semiconductor device, since the intervals between wirings are practically reduced, cross-talk occurs between the wirings, so that parasitic capacitance is increased, which has a negative influence on the actuating speed of a circuit.

As a solution for such problems, there is known in the conventional art a planarized wiring connection technique by K. Ueno et al. disclosed in "A Quarter-Micron Planarized Interconnection Technology With Self-Aligned Plug", IEEE JOURNAL, 1992, pages 305–308.

The conventional planarized wiring connection technique solves the above problem in a manner that the corners of a contact hole are formed by self-alignment in a horizontal direction to a conductor line, details of which are as follows.

First, as shown in FIG. 1A, an etch-stop layer 2 is deposited on a planarized insulating layer 1. Then, as shown in FIG. 1B, the etch-stop layer 2 and the insulating layer 1 are selectively etched so as to form an interconnection trench 3.

After the interconnection trench 3 is formed, a photoresist film 4 is deposited and selectively developed. And, a contact hole 5 is formed by self-alignment by etching the insulating layer 1. That is, patterns of the trench 3 and the contact hole 5 are formed by electron beam lithography(not shown). The pattern of the contact hole 5 overlaps the interconnection trench 3.

After the interconnection trench 3 and the contact hole 5 are formed, as shown in FIGS. 1B and 1C, a metal layer(i.e., tungsten) is deposited in the interconnection trench 3 and the contact hole 5. And then, in order to allow the metal layer to be formed as a planarized wiring, the metal layer is etched back by chemical-mechanical polishing, according to which a plug 6 and an interconnection 7 are formed as shown in FIG. 1D.

However, such a planarized wiring technique has disadvantages in that the interconnection trench and the contact hole are only connected by self-alignment in a lengthwise direction of the wiring, but can not be adjusted by self-alignment in a vertical direction of the length of the wiring. Further, the photolithography process must be necessarily be performed two times in order to form the interconnection trench and the contact hole.

SUMMARY OF THE INVENTION

Therefore, an object of the present invention is to provide a method for fabricating wiring in a semiconductor device by only a single photolithography process and forming a contact hole by self-alignment in a lengthwise direction and in a vertical direction of a conductor line.

Another object of the present invention is to provide a method for fabricating wiring in a semiconductor device in which a window is selectively formed by a side wall only at a conductive groove where a contact hole is to be formed so as to form the contact hole, without additionally using a photoresist film mask.

In order to obtain the first object, there is provided a method for fabricating wiring in a semiconductor device including the steps of: forming an insulating layer on a substrate; forming an etch-stop layer on the insulating layer; etching the etch-stop layer at a wiring region connected to a window and etching the insulating layer to a predetermined thickness; forming a mask layer on the etch-stop layer and the insulating layer; etching the mask layer to remove the mask layer at a central part of the window; and etching the insulating layer of through central part of the window so as to form a contact hole.

In order to obtain the second object, there is provided a method for fabricating wiring in a semiconductor device including the steps of: forming an insulating layer on a substrate having a conductive layer formed thereon; forming an etch-stop layer at an upper part of the insulating layer; etching the etch-stop layer at a wiring region connected to a window and etching the insulating layer to a predetermined thickness; forming a mask layer on the etch-stop layer and the insulating layer; etching the mask layer to remove the mask layer at a central part of the window; etching the insulating layer of the central part of the window so as to form a contact hole; and forming a wiring layer on the insulating layer having the contact hole.

BRIEF DESCRIPTION OF THE DRAWINGS

FIGS. 4A to 4F are cross-sectional views showing steps of a method for fabricating the wiring in a semiconductor device in accordance with the first embodiment of the present invention(for reference, cross-sectional views are taken along the line C—C of FIG. 5);

FIG. 5 shows a layout of wiring of the first embodiment in accordance with the present invention;

FIG. 6 is a cross-sectional view showing another embodiment of FIG. 2E; and

DETAILED DESCRIPTION OF THE INVENTION

Preferred embodiments of the present invention will now be described with reference to the accompanying drawings.

A method for fabricating wiring in a semiconductor device according to preferred embodiments of the present invention will now be described in detail with reference to FIGS. 2A to 2F, FIGS. 3A to 3F and FIGS. 4A to 4F.

Figure 1A:
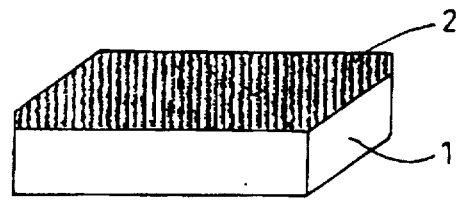
FIGS. 1A to 1D are cross-sectional views showing steps of a conventional method for fabricating wiring.
Figure 1B:
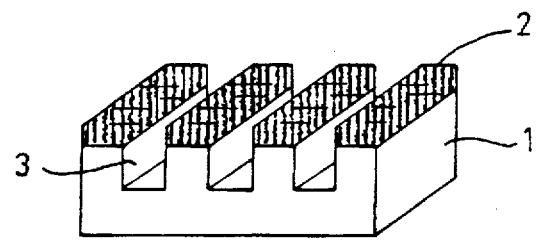
Figure 1C:
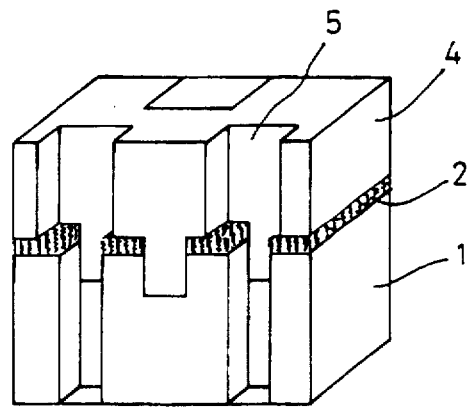
Figure 1D:
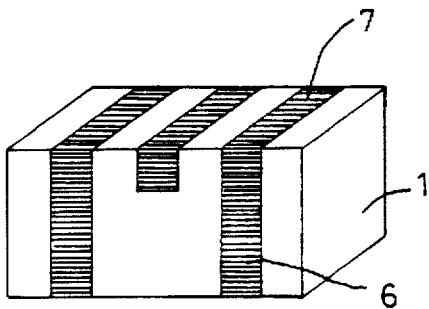
Figure 2A:
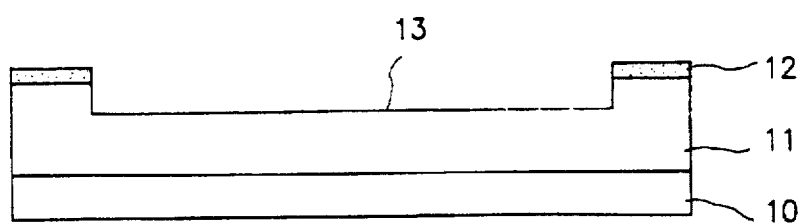
FIGS. 2A to 2F are cross-sectional views showing steps of a method for fabricating the wiring in a semiconductor device in accordance with a first embodiment of the present invention(for reference, cross-sectional views are taken along the line A—A of FIG. 5)
Figure 2E:
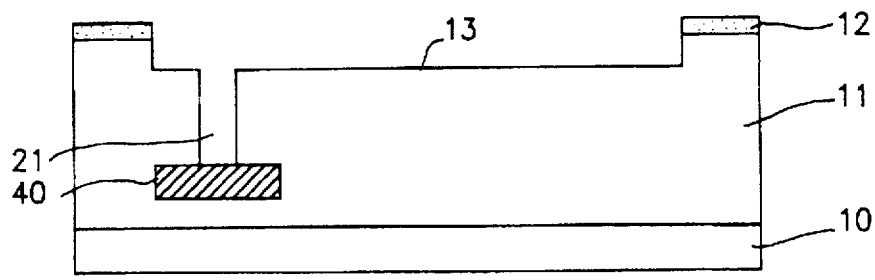
Figure 2F:
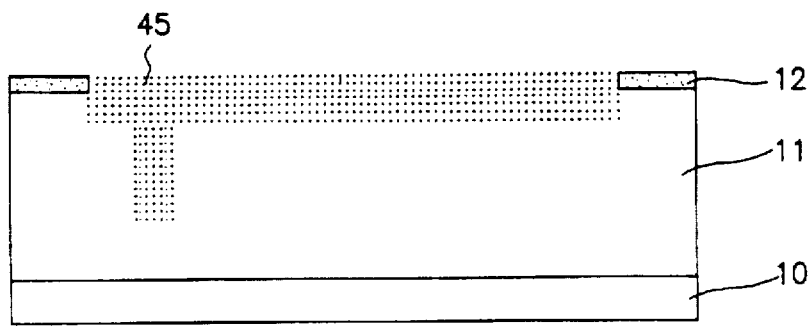
Figure 3A:
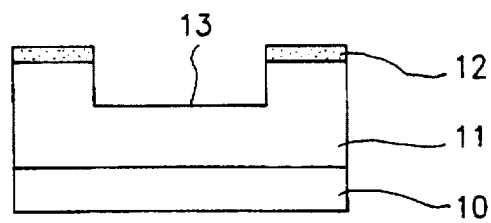
FIGS. 3A to 3F are cross-sectional views showing steps of a method for fabricating the wiring in a semiconductor device in accordance with the first embidment of the present invention(for reference, cross-sectional views are taken along the line B—B of FIG. 5)
Figure 3E:
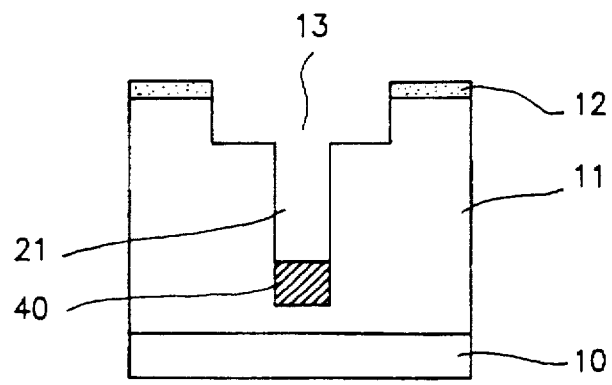
Figure 3F:
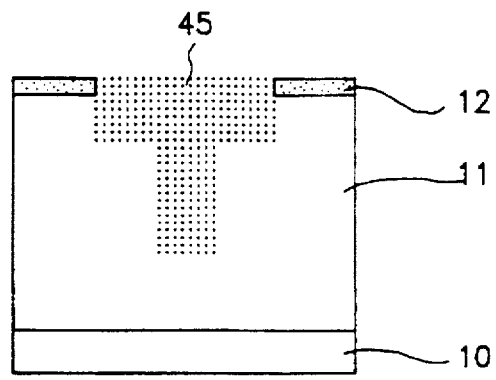
Figure 4A:
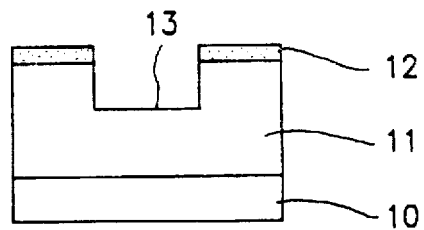

As shown in FIGS. 2A, 3A and 4A, an insulating layer 11 for insulating and isolating a lower conductive layer (referring to reference numeral 40 in FIG. 2E and FIG. 3E) is formed on an upper part of one side of a substrate 10. The reason why the insulating layer 11 is shown to be narrow in FIG. 4A is only because a wiring region 25 thereof (to be described later) has a narrower width than a window 20. An etch-stop layer 12 is deposited on an upper part of the insulating layer 11.

The insulating layer 11 is one selected from $O_3$/TEOS $SiO_2$, BPSG (Boron Phosphorous Silicate Glass), and uses an anisotropy etching without having a masking step when it is etched. Also, an etch-stop layer 12 is formed, having a lower etching rate than that of the insulating layer 11, on the upper part of the insulating layer 11. And, a conductive groove 13 is formed in a predetermined portion of the insulating layer 11.

The etch-stop layer 12 has an etch-selectivity with a mask layer(reference numeral 15 in FIGS. 2B, 3B and 4B to be described later). The etch-stop layer 12 is one selected from a nitride layer or an oxide layer.

After formation of the etch-stop layer 12, as shown in FIG. 5 and FIG. 2A, the etch-stop layer 12 of the wiring region 25 connected to the window 20 and the insulating layer 11 with a predetermined thickness are etched, details of which will now be described with reference to FIG. 5.

FIG. 5 shows a layout of wiring of one embodiment in accordance with the present invention. A conductor line 30 includes a window 20 and a wiring region 25. A contact hole 21 is formed at the center of the window 20. It is preferable that the diameter d' of the window 20 is more than two times the width of A' the wiring region 25.

Figure 2B:
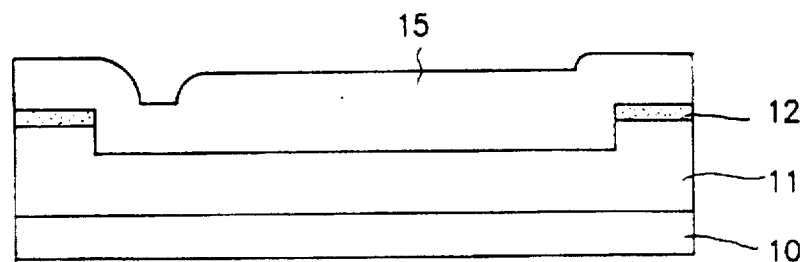
Figure 2C:
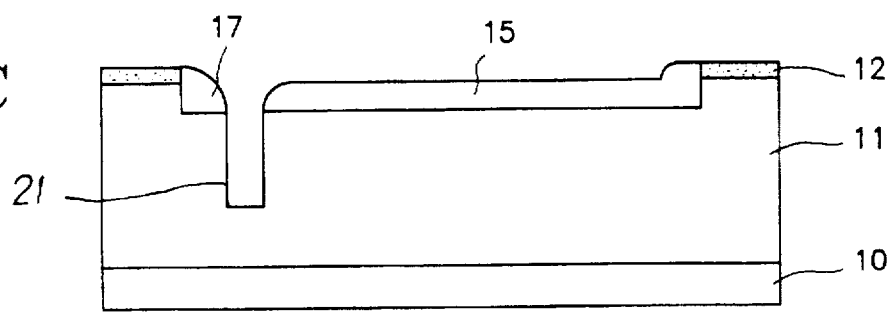
Figure 2D:
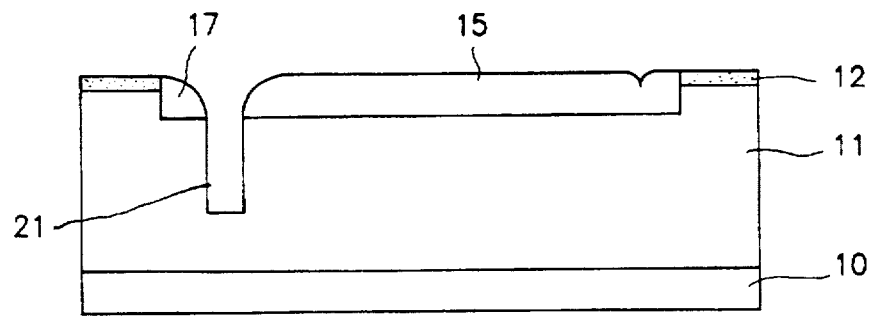
Figure 3B:
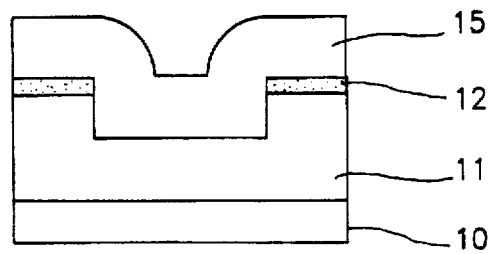
Figure 3C:
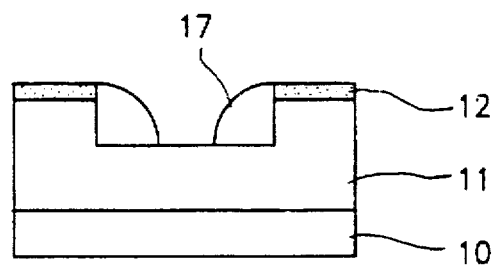
Figure 3D:
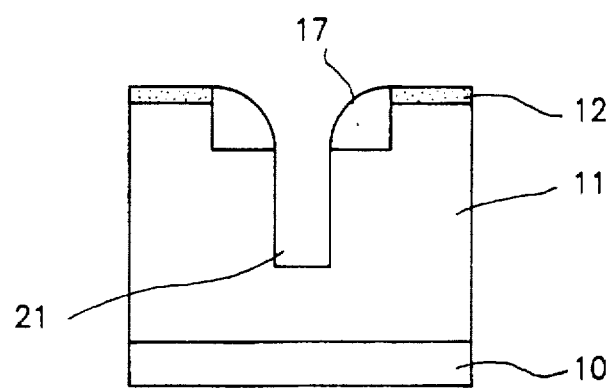
Figure 4B:
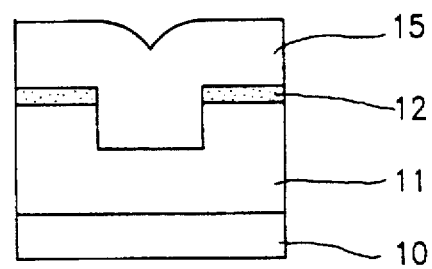
Figure 4C:
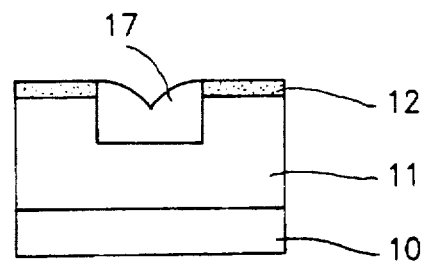
Figure 4D:
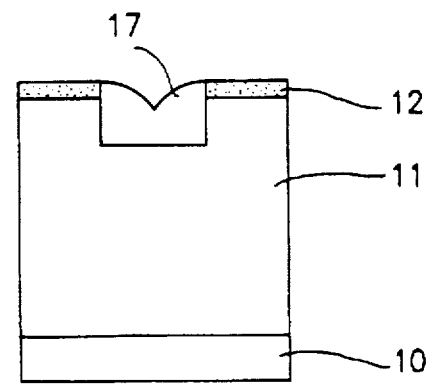

As shown in FIGS. 2B, 3B and 4B, a mask layer 15 is formed on an upper part of the etch-stop layer 12 and the insulating layer 11. The mask layer 15 is a nitride layer.

As shown in FIGS. 2C, 3C, 4C and FIG. 5, the mask layer 15 is etched to remove the mask layer 15 from the central part of the window 20.

After removing the mask layer 15 as described above, as shown in FIGS. 2C, 2D, 3D and 4D, the insulating layer 11 at the central part of the window is etched so as to form the contact hole 21. In forming the contact hole 21, the insulating layer 11 is anisotropy-etched by using the mask layer 15 as a mask. That is, the insulating layer 11 and the mask layer 15 are selectively etched.

On the other hand, as shown in FIGS. 2E and 3E, in case that a lower conductive layer 40 exists at one side of the insulating layer 11, the wiring is fabricated as follows.

Similarly to the above embodiment, the insulating layer 11 is formed on the substrate 10 having the lower conductive layer 40 formed therein, and an etch-stop layer 12 is formed on an upper part of the insulating layer 11. Then, the etch-stop layer 12 of a wiring region 25 connected to a window 20 and the insulating layer 11 are etched.

In the meantime, in FIGS. 2A to 2D, FIGS. 3A to 3D and FIGS. 4A to 4D, even though there are not shown portions corresponding to the lower conductive layer 40, it is regarded as that a lower conductive layer corresponding to those of FIG. 2E and FIG. 3E is omitted, respectively. The lower conductive layer 40 is one selected from Al, Cu or an alloy. The lower conductive layer 40, as shown in FIG. 6, may be substituted by an impurity region 41 formed at one side of the substrate 10, in applying the wiring fabrication method as described.

After the etching steps described above, likewise as in the previous embodiment, a contact hole 21 is formed, and a wiring layer 45 is additionally formed on an upper part of the insulating layer 11 having a contact hole 21. The wiring layer 45 is made of one selected from Al, Cu or an alloy.

A method for fabricating the wiring layer 45 further includes, as shown in FIGS. 2B to 2F, 3B to 3F and 4B to 4F, the steps of forming a mask layer 15 on the insulating layer 11 including the contact hole 21 and an etch-stop layer 12; and selectively removing the mask layer 15 above the etch-stop layer 12. The mask layer 15 is removed by a CMP (Chemical Mechanical Polishing) or an etch-back.

As shown in FIG. 5, the area of the insulating layer 11 to be removed at the portion of the central part of the window 20 is dependent upon the thickness of the mask layer 15.

FIGS. 7A to 7D shows another embodiment of a method for fabricating wiring in a semiconductor device in accordance with the present invention, details of which will now be described.

Figure 7A:
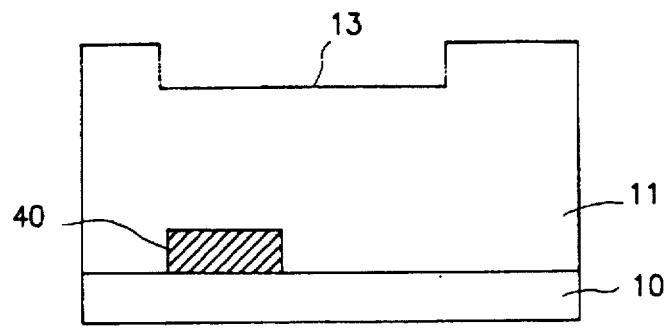
FIGS. 7A to 7D are cross-sectional views showing second embodiment in accordance with the present invention.

Similarly to the aforementioned embodiment, referring to FIG. 7A, an insulating layer 11 is formed on an substrate 10. The insulating layer 11 is one selected from $O_3$TEOS $SiO_2$, or BPSG, of which the characteristics are the same as or similar to the aforementioned embodiment. And, a conductive groove 13 is formed at a predetermined upper part of the insulating layer 11. Also, at a predetermined portion of the insulating layer 11, there is formed a lower conductive layer 40.

Figure 7B:
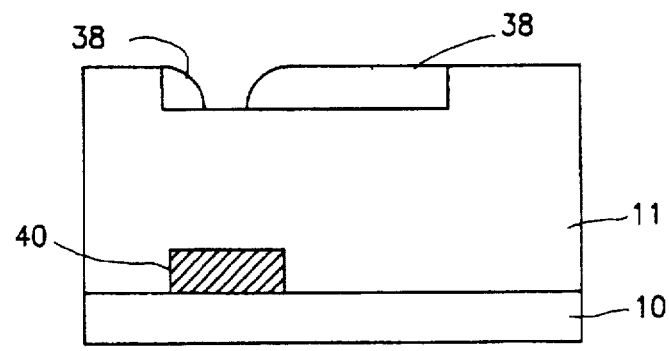

Referring to FIG. 7B, similarly to the aforementioned embodiment, the insulating layer 11 of a wiring region 25 connected to a window 20 is etched to a predetermined thickness. Then, a first conductive layer 38 is formed on an upper part of the insulating layer 11. The first conductive layer 38 is one selected from Al, Cu or an alloy.

Figure 7C:
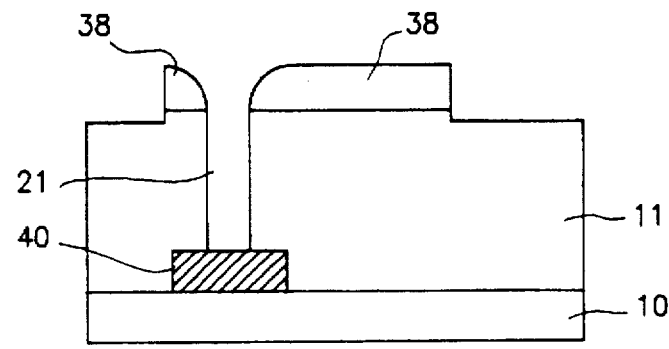

Referring to FIG. 7C, the first conductive layer 38 is etched, and the mask layer at the central part of the window 20 is etched, and then the insulating layer 11 is etched by using the first conductive layer 38 as a mask so as to form a contact hole 21.

Figure 7D:
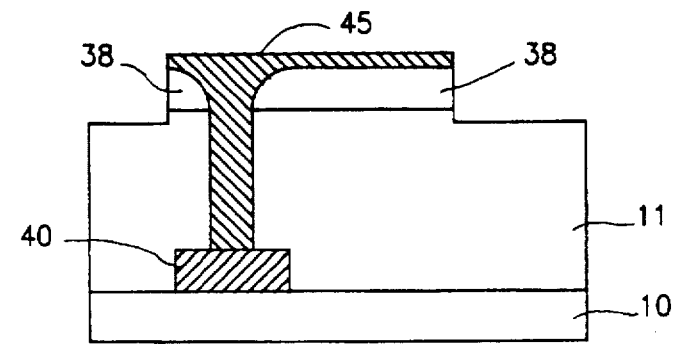

Referring to FIG. 7D, the wiring layer 45 is formed on an upper part of the insulating layer 11 having the contact hole 21. The wiring layer 45 is made of one selected from Al, Cu or an alloy.

As so far described, according to the disclosed method for fabricating wiring in a semiconductor device, since all corners of the contact hole are self-aligned within the conductor line, its reliability can be highly improved. Also, the process is simplified by a single photolithography, and moreover, the contact hole is formed by self-alignment in the lengthwise direction and the vertical direction of the length of the conductor line.

What is claimed is:

1. A method for fabricating wiring in a semiconductor device comprising the steps of:

forming an insulating layer on a substrate;

forming an etch-stop layer on the insulating layer;

etching the etch-stop layer at areas corresponding to a wiring region and a window region, wherein a width of the window region is larger than a width of the wiring region;

etching exposed portions of the insulating layer to form the wiring region and the window region in the insulating layer;

forming a mask layer on remaining portions of the etch-stop layer and the etched portions of the insulating layer;

etching the mask layer until the mask layer at a central portion of the window region has been removed; and etching an exposed portion of the insulating layer at the central part of the window region so as to form a contact hole.

2. The method according to claim 1, wherein the insulating layer is one selected from $O_3$/TEOS $SiO_2$, and BPSG.

3. The method according to claim 1, wherein the width of the window region is more than two times the width of the wiring region.

4. The method according to claim 1, wherein a thickness of the mask layer is more than at least one-half of the width of the wiring region.

5. The method according to claim 1, wherein the mask layer is anisotropically etched without a masking step.

6. The method according to claim 5, wherein the mask layer in both the wiring region and a side wall of the window region remain, whereas the mask layer in the central part of the window region is removed.

7. The method according to claim 1, wherein the contact hole is formed by anisotropically etching the exposed portion of the insulating layer using the mask layer as a mask.

8. The method according to claim 1, wherein the etch-stop layer has an etch-selectivity with the mask layer.

9. The method according to claim 1, wherein the etch-stop layer is one selected from a nitride layer and an oxide layer.

10. The method according to claim 1, wherein the mask layer is a nitride layer.

11. The method according to claim 1, wherein the insulating layer and the mask layer are selectively etched.

12. A method for fabricating wiring in a semiconductor device comprising the steps of:

forming an insulating layer on a substrate having a conductive layer thereon;

forming an etch-stop layer on an upper part of the insulating layer;

etching the etch-stop layer at areas corresponding to a wiring region and a window region, wherein a width of the window region is larger that a width of the wiring region;

etching exposed portions of the insulating layer to form the wiring region and the window region in the insulating layer;

forming a mask layer on remaining portions of the etch-stop layer and the etched portions of the insulating layer;

etching the mask layer until the mask layer at a central portion of the window region has been removed;

etching an exposed portion of the insulating layer at the central part of the window region so as to form a contact hole; and forming a wiring layer on the insulating layer having the contact hole.

13. The method according to claim 12, wherein the conductive layer is one selected from Al, Cu and an alloy.

14. The method according to claim 12, wherein the conductive layer corresponds to an impurity region formed on the substrate.

15. The method according to claim 12, wherein the insulating layer is one selected from $O_3$/TEOS $SiO_2$, and BPSG.

16. The method according to claim 12, wherein the width of the window region is more than two times of the width of the wiring region.

17. The method according to claim 12, wherein a thickness of the mask layer is more than at least one-half of the width of the wiring region.

18. The method according to claim 12, wherein the mask layer is anisotropically etched without masking step.

19. The method according to claim 18, wherein the mask layer in both the wiring region and a side wall of the window region remain whereas the mask layer in the central portion of the window region is removed.

20. The method according to claim 12, wherein the contact hole is formed by anisotropically etching the exposed portion of the insulating layer using the mask layer as a mask.

21. The method according to claim 12, wherein the etch-stop layer has an etch-selectivity with the mask layer.

22. The method according to claim 12, wherein the etch-stop layer is one selected from a nitride layer and an oxide layer.

23. The method according to claim 12, wherein the mask layer is a nitride layer.

24. The method according to claim 12, wherein the insulating layer and the mask layer are selectively etched.

25. The method according to claim 12, wherein the wiring layer is one selected from one of Al, Cu and an alloy.

26. The method according to claim 12, wherein the step for forming the wiring layer further includes the steps of:

forming a conductive layer on the insulating layer having the contact hole and the etch-stop layer; and selectively removing the conductive layer above the etch-stop layer.

27. The method according to claim 26, wherein the conductive layer is removed by one of a CMP and an etch-back.

28. The method according to claim 12, wherein a removal area of the insulating layer at the central part of the window region is dependent upon a thickness of the mask layer.

29. A method for fabricating wiring of a semiconductor device comprising the steps of:

forming an insulating layer on a substrate;

etching the insulating layer to form a wiring region and a window region connected to the wiring region, wherein a width of the window region is larger than a width of the wiring region;

forming a first conductive layer on the insulating layer;

etching the first conductive layer until the conductive layer at a central portion of the window region is removed; and etching an exposed portion of the insulating layer so as to form a contact hole.

30. The method according to claim 29, wherein the insulating layer is one selected from $O_3$/TEOS $SiO_2$, and BPSG.

31. The method according to claim 29, wherein the width of the window region is more than two times the width of the wiring region.

32. The method according to claim 29, wherein a thickness of the mask layer is more than at least one-half of the width of the wiring region.

33. The method according to claim 29, wherein the mask layer is anisotropically etched without a masking step.

34. The method according to claim 29, wherein the mask layer in both the wiring region and a sidewall of the window region remain, whereas the mask layer in the central part of the window region is removed.

35. The method according to claim 29, wherein the contact hole is formed by anistotropically etching the exposed portion of the insulating layer using the mask layer as a mask.

36. The method according to claim 29, wherein the etch-stop layer has an etch-selectivity with the mask layer.

37. The method according to claim 29, wherein the etch-stop layer is one selected from a nitride layer and an oxide layer.

38. The method according to claim 29, wherein the mask layer is a nitride layer.

39. The method according to claim 29, wherein the insulating layer and the mask layer are selectively etched.

40. The method according to claim 29, wherein the first conductive layer is one selected from Al, Cu and an alloy.

* * * * *